US007063902B2

(12) United States Patent
Kikuchi et al.

(10) Patent No.: US 7,063,902 B2
(45) Date of Patent: Jun. 20, 2006

(54) ORGANIC ELECTROLUMINESCENCE DISPLAY DEVICE (75) Inventors: Hiroshi Kikuchi, Zushi (JP); Nobuyuki Ushifusa, Yokohama (JP); Issei Takemoto, Hiratsuka (JP)

(73) Assignees: Hitachi, Ltd., Tokyo (JP); Hitachi Displays, Ltd., Mobara (JP)

( * ) Notice: Subject to any disclaimer, the term of this patent is extended or adjusted under 35 U.S.C. 154(b) by 0 days.

(21) Appl. No.: 10/752,679

(22) Filed: Jan. 8, 2004

(65) Prior Publication Data

US 2004/0191566 A1 Sep. 30, 2004

(30) Foreign Application Priority Data

Mar. 3, 2003 (JP) ............................ 2003-055929

(51) Int. Cl.
*H05B 33/04* (2006.01)
*H01L 51/50* (2006.01)

(52) U.S. Cl. ...................... 428/690; 428/917; 428/323; 313/512; 257/100

(58) Field of Classification Search ................. 428/690, 428/917, 323; 313/512; 257/100
See application file for complete search history.

(56) References Cited

U.S. PATENT DOCUMENTS

| 6,551,724 | B1 * | 4/2003 | Ishii et al. ................... 428/690 |
| 6,620,297 | B1 * | 9/2003 | Conte et al. ............ 204/192.11 |
| 2002/0003403 | A1 * | 1/2002 | Ghosh et al. ................ 313/512 |
| 2002/0068191 | A1 * | 6/2002 | Kobayashi ................... 428/690 |
| 2003/0143423 | A1 * | 7/2003 | McCormick et al. ....... 428/690 |

FOREIGN PATENT DOCUMENTS

| JP | 5-182759 | 7/1993 |
| JP | 8-236271 | 9/1996 |
| JP | 9-148066 | 6/1997 |
| JP | 2001-68266 | 3/2001 |

* cited by examiner

Primary Examiner—Dawn L. Garrett
(74) Attorney, Agent, or Firm—Antonelli, Terry, Stout and Kraus, LLP.

(57) ABSTRACT

An OLED display device having a laminate encapsulating structure containing: an OLED substrate having a leading wire and a pixel area which carries a number of OLEDs on a glass substrate; and an encapsulating plate; and a filler filling a space between the OLED substrate and the encapsulating plate, wherein the filler is dispersed with a desiccant and fine metallic particles for improving electroconductivity and thermoconductivity. This structure not only can prevent an inflow of moisture into the OLEDs and secure a mechanical strength of the OLED display device as a flat panel display device, but also accelerate a heat radiation and improves electroconductivity of a conductive layer.

22 Claims, 9 Drawing Sheets

| CHARACTERISTIC ITEMS | ORIGINAL | CONVENTIONAL |
|---|---|---|
| BRIGHTNESS ($cd/m^2$) | 1000 | 1000 |
| APPLIED VOLTAGE (V) | 6 | 8 |
| LIFE TIME (hours) | > 1000 | 550 |
| PRESSURE RESISTANCE OF PANEL | GOOD | NOT GOOD |

FIG.10

| RUN NO. | A | B | C | D | E | F | G |
|---|---|---|---|---|---|---|---|
| EPOXY RESIN | 100 | 100 | 100 | 100 | 100 | 100 | 100 |
| CURING AGENT | 30 | 30 | 30 | 30 | 30 | 30 | 30 |
| Cu PARTICLES | 0 | 10 | 20 | 40 | 80 | 120 | 150 |
| CaO PARTICLES | 5 | 5 | 5 | 5 | 5 | 5 | 5 |
| COUPLING AGENT | 0.1 | 0.1 | 0.1 | 0.1 | 0.1 | 0.1 | 0.1 |
| LIFE TIME (hours) | 520 | 950 | >1000 | >1000 | >1000 | >1000 | — |
| PRESSURE RESISTANCE OF PANEL | GOOD | GOOD | GOOD | GOOD | GOOD | GOOD | — |

FILLER COMPOSITION : PARTS BY WEIGHT

FIG.11

| RUN NO. | A | B | C | D | E | F | G |
|---|---|---|---|---|---|---|---|
| EPOXY RESIN | 100 | 100 | 100 | 100 | 100 | 100 | 100 |
| CURING AGENT | 30 | 30 | 30 | 30 | 30 | 30 | 30 |
| Ag PARTICLES | 0 | 10 | 30 | 50 | 80 | 120 | 150 |
| CaO PARTICLES | 5 | 5 | 5 | 5 | 5 | 5 | 5 |
| COUPLING AGENT | 0.1 | 0.1 | 0.1 | 0.1 | 0.1 | 0.1 | 0.1 |
| LIFE TIME (hours) | 560 | >1000 | >1000 | >1000 | >1000 | >1000 | — |
| PRESSURE RESISTANCE OF PANEL | GOOD | GOOD | GOOD | GOOD | GOOD | GOOD | — |

FILLER COMPOSITION : PARTS BY WEIGHT

ORGANIC ELECTROLUMINESCENCE DISPLAY DEVICE

FIELD OF THE INVENTION

The present invention relates to a flat panel display device, in particular an organic electro-luminescence display device, a pixel of which is composed of an organic light emitting diode (OLED).

BACKGROUND OF THE INVENTION

Attempts have been made in the technical development for commercializing flat panel display devices which use OLEDs to prevent moisture-caused deterioration of OLED characteristics, and to partly solve problems involved in means for securing mechanical strength associated with flat panel display devices. For example, JP-A-9-148066 discloses use of a desiccant; JP-A-8-236271 discloses a structure with a gap between a substrate which constitutes an OLED and encapsulating can (or plate) filled with a rubber elastomer to prevent inflow of moisture; JP-A-5-182759 discloses a structure with a gap between a substrate which constitutes an OLED and encapsulating plate filled with an UV curing resin; and JP-A-2001-68266 discloses a structure with a gap between a substrate which constitutes an OLED and encapsulating can filled with a desiccant-containing gel component.

SUMMARY OF THE INVENTION

OLEDs, which mainly use an organic substance as an electrical field light-emitting device, have been extensively developed, because they are suitable for flat panel displays. They have made remarkable progress in many areas, e.g., light-emitting materials, device structures, encapsulating techniques and production techniques.

In order to realize highly reliable, flat panel display devices using these OLEDs, it is necessary to accurately position light-emitting diodes of an organic material having highly efficient light-emitting characteristics as OLEDs on a pixel area of an insulating substrate, e.g., glass substrate. Moreover, in order to provide a highly reliable display device stably serviceable over a long time, techniques which can adequately encapsulate the substrate on which a pixel of OLED is formed are essential. The technical problems to be solved for encapsulation are widely varying, and some of them are listed below:

Problem (1) Removal of moisture

Problem (2) Securing mechanical strength

Problem (3) Improvement of thermoconductivity

Problem (4) Improvement of electroconductivity

The above conventional techniques have provided some effective solutions for preventing inflow of moisture into OLEDs or for securing mechanical strength of flat panel display devices. However, they do not sufficiently recognize improvement of thermoconductivity of a display device to efficiently radiate heat generated therein or improvement of electroconductivity of an electroconductive layer which constitutes an OLED as technical problems on top of preventing moisture inflow and securing mechanical strength. They are completely silent on any method for simultaneously solving the problems of preventing moisture inflow, securing mechanical strength, and improvement of thermoconductivity and electro-conductivity. Simultaneous solution of these problems is becoming increasingly difficult, in particular as a display screen increases in size, as discussed below.

It is an object of the present invention to provide an OLED display device which can simultaneously solve the problems of preventing moisture inflow which may deteriorate device characteristics, securing mechanical strength of the device as a flat panel display device, improvement of thermoconductivity of the device for controlling display performance deterioration caused by heat generated in the display, and improvement of electroconductivity of an electroconductive layer which constitutes the OLED.

In order to simultaneously solve these problems, the OLED display device of the present invention has a laminate structure comprising: a substrate having a pixel area (sometimes referred to as display area) in which a number of pixels, each being composed of at least an OLED, are disposed in a matrix form; an encapsulating plate; and a filler which fills a space between the substrate (OLED substrate, hereinafter referred to as pixel substrate or active matrix substrate) and the encapsulating plate.

In the present invention, the filler can comprise a desiccant dispersed with fine metallic particles to have increased thermoconductivity and electroconductivity. This can simultaneously solve the problems of preventing moisture inflow into the pixel area, securing mechanical strength of the device, and improvement of thermoconductivity and electroconductivity, thereby providing the OLED display device which can control deterioration of its light-emitting characteristics for extended periods.

Details of means for the present invention to solve these problems will be clarified in the preferred embodiments and examples described later. It is needless to say that the present invention is not limited by the descriptions in the claims, preferred embodiments or examples, and that variations may be made without departing from the technical concept of the present invention.

BRIEF DESCRIPTION OF THE DRAWINGS

These and other features, objects and advantages of the present invention will become more apparent from the following description when taken in conjunction with the drawings wherein.

DETAILED DESCRIPTION OF PREFERRED EMBODIMENTS

The preferred embodiments and specific examples of the present invention are described in detail by referring to the attached drawings.

Figure 1:
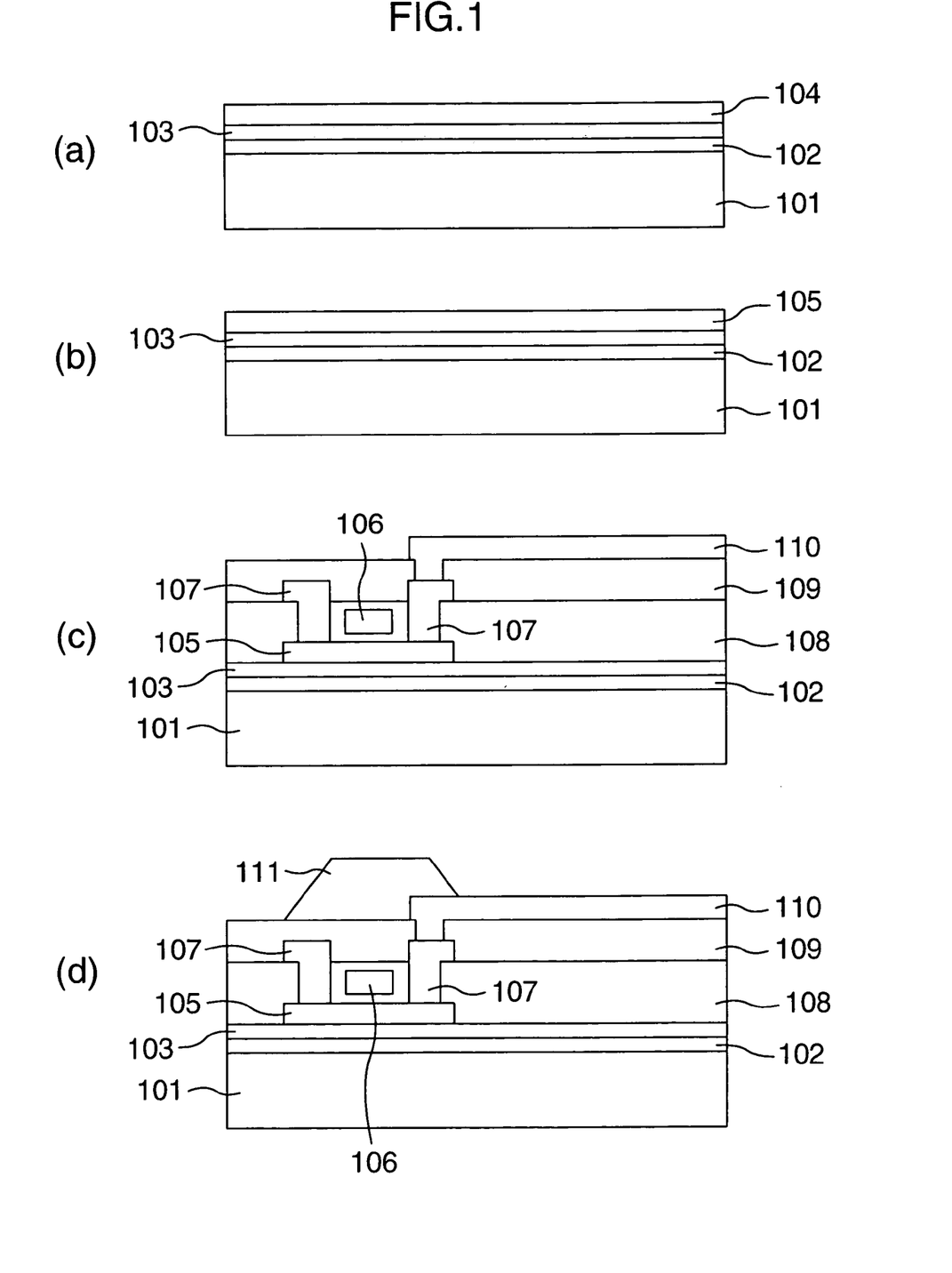
FIG. 1 provides cross-sectional views illustrating a process for producing one embodiment of the OLED display device of the present invention and its encapsulating structure.
Figure 2:
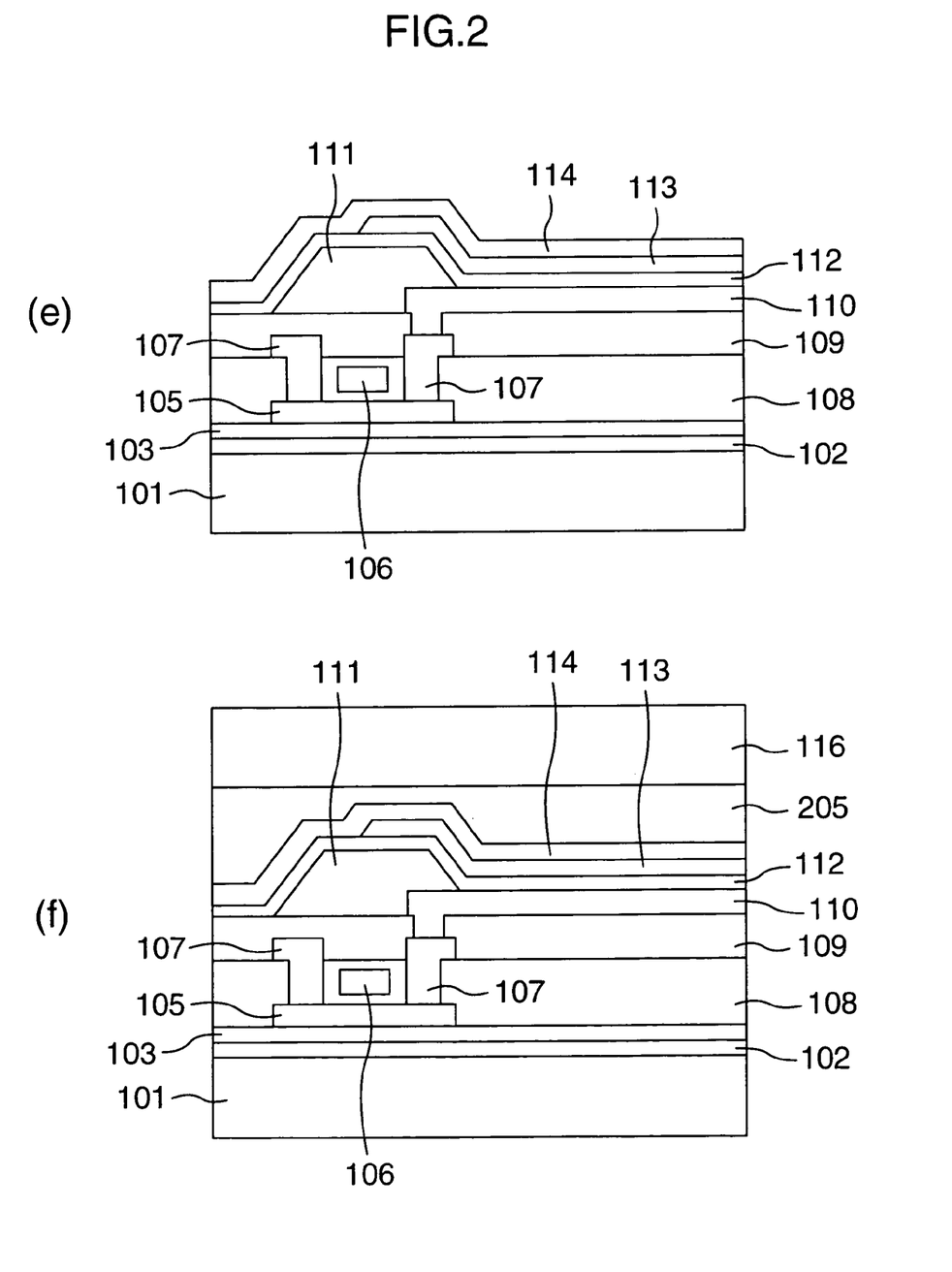
FIG. 2 provides cross-sectional views following those shown in FIG. 1, illustrating a process for producing one embodiment of the OLED display device of the present invention and its encapsulating structure.

FIGS. 1 and 2 provide cross-sectional views illustrating a process for producing one embodiment of the OLED display device of the present invention and its encapsulating structure, where (a) to (d) in FIG. 1 are followed by(e) and (g) in FIG. 2.

Referring to FIGS. 1 and 2, the glass substrate 101, serving as an OLED substrate on which pixel circuits driving OLEDs are formed, is coated thinly with the SiN film 102 and SiO film 103 serving as a layered barrier film by an adequate procedure, e.g., CVD, and then with the amorphous silicon film 104 to a thickness of around 50 nm by CVD (FIG. 1(a)). The layered structure and thickness of the barrier film, and silicon film thickness represent only examples, and should not be understood to limit the present invention.

Next, the amorphous silicon film 104 is modified into the polysilicon film 105 by crystallization, e.g., excimer laser annealing for the portion on which the pixel circuits are to be formed (FIG. 1(b)).

The modified silicon film 105, formed by the procedure described above, is etched into an island shape to have an intended circuit, and coated with a gate insulator (not shown), the gate wiring 106, interlayer insulator 107, source drain wiring 108, passivator 109 and transparent electrode 110 serving as a pixel electrode, in this order (FIG. 1(c)). The transparent electrode 110 is of metal oxide, e.g., indium tin oxide (ITO). Thus, the active matrix substrate serving as the OLED substrate on which transistor circuits are formed on the pixel area is completed.

Number of transistors required to drive an OLED is normally 2 to 5 per pixel, and a pixel circuit has an optimum structure by combining transistors. A low-current driving circuit composed of a CMOS circuit is one recommended example of the pixel circuit. Details of processing techniques for forming the pixel circuit, its electrode and so on are known to the related industries, and are not described in this specification. It is also known that an additional step, e.g., ion implantation or activation annealing, is required in a process for producing transistor circuits constituting a pixel circuit.

Next, the diode separation zone 111 is formed on the periphery of the transparent electrode 110 on the active matrix substrate as the OLED substrate, to form the OLED for one embodiment of the present invention (FIG. 1(d)). The diode separation zone 111 is required to be insulating, and may be made of an organic material, e.g., polyimide, or inorganic material, e.g., SiO or SiN. The methods for making a film of the diode separation zone 111 and producing patterns are also known to the related industries.

Next, the transparent electrode 110 is coated with the hole transfer layer 112 of an organic EL (OLED) material, light-emitting/electron transfer layer 113 and cathode 114, in this order (FIG. 2(e)). It is known that a multi-color display can be produced by forming the light-emitting/electron transfer layers 113 emitting different colors only on the specific, transparent electrodes 110 using an evaporation mask in the process for forming the above layers and electrode.

An OLED is normally produced by the following procedures. However, it should be stressed that the procedures described below are examples intended to illustrate but not to limit the present invention.

(1) Pretreatment of ITO Electrode to be the Transparent Electrode

An ITO electrode is treated with an oxygen plasma for 2 minutes, after the active matrix substrate carrying the ITO electrode is placed in a vacuum chamber with the electrode surface exposed.

(2) Formation of Hole Transfer Layer

Diphenylnaphthyldiamine (NPD) is evaporated (vapor-deposited) under a vacuum from a W boat, where it is recommended to use an evaporation mask (vapor deposition mask) for evaporating NPD selectively onto a pixel area. The boat is heated in a controlled manner to secure the conditions of substrate temperature: room temperature, degree of vacuum: $10^{-4}$ Pa and evaporation (vapor-deposition) rate: 0.1 to 1 nm/second, to have a film thickness of 50 nm as one example.

(3) Formation of Electron Transfer Layer/Light-emitting layer

A tris(8-quinolinol) aluminum complex (Alq3) derivative and a dopant material are evaporated from a W boat for each of the three primary colors (RBG) for pixels using an evaporation mask. The boat is heated in a controlled manner to secure the conditions of substrate temperature: room temperature, degree of vacuum: $10^{-4}$ Pa and evaporation rate: 0.1 to 1 nm/second, to have a film thickness of 70 nm as one example.

(4) Formation of Cathode

LiF for electron injection and aluminum (Al) for the cathode are continuously evaporated using an evaporation mask onto the entire pixel area except its periphery. The boat is heated in a controlled manner to secure the conditions of substrate temperature: room temperature, degree of vacuum: $10^{-4}$ Pa and evaporation rate: 0.1 to 1 nm/second, to have a LiF film thickness of 0.5 nm and Al thickness of 150 nm as one example.

It is known to the related industries that a positive hole transfer material forming hole (positive hole) transfer layer 112 or an electron transfer material forming electron transfer layer/light-emitting layer 113 are not limited to the above-described one but may be selected from widely diversified materials described below. It is also known to the related industries that an electron transfer layer and light-emitting layer are separated from each other to be individually composed of a different material, and that a light-emitting layer is doped with a dopant to control its light-emitting intensity and color tone.

The positive hole transfer material forming the hole transfer layer 112 include aromatic mono-, di-, tri- and tetra-polyamines and derivatives and polymers thereof, represented by NPD, to begin with; and hydrazone, silanamine, enamine, quinacridone, phosphamine, phenanthridine, benzylphenyl and styryl compounds. Other compounds which can be used for the layer 112 include polymers, e.g., polyvinyl carbazole, polycarbonate, polysilane, polyamide, polyaniline, polyphosphazene and polymethacrylate containing an aromatic amine.

Electron transfer materials include 8-hydroxyquinoline aluminum complex and a derivative thereof, represented by Alq3; derivatives of cyclopentadiene, perynone, oxadiazole, bisstyryl benzene, distyryl pirazine, pyridine, naphthylizine and triazine etc.; a nitrile compound and p-phenylene compound; and rare-earth element complex.

Thus, the OLED area is completed. The OLED area, i.e., OLED substrate carrying the pixel area in which pixels are formed in a matrix, is screen-printed with the filler material 205 spread selectively on the pixel area. Then, the filler material 205 is coated with the encapsulating plate 116, to complete the encapsulation (FIG. 1(f)).

Figure 3:
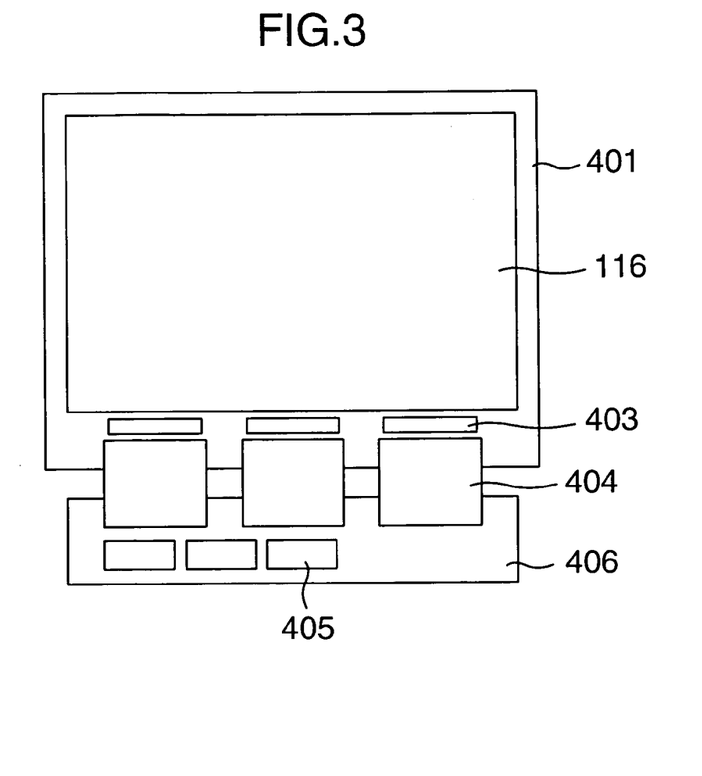
FIG. 3 shows an exterior of one embodiment of the OLED display device assembly of the present invention.

FIG. 3 shows an exterior of one embodiment of the OLED display device assembly of the present invention. The OLED display device comprises, as shown in FIG. 3, the OLED substrate 401 and encapsulating plate 116, which are produced by the above procedures, assembled into a monolithic structure, provided with the driver LSI 403 at the leading wiring area and then with connecting tape wirings 404, to be connected to the circuit substrate 406 on which the LSI 405 for controlling or power supplying services are mounted. This completes the OLED panel module. A display device, e.g., monitor, is completed when the OLED panel module is assembled in an adequate box (not shown). The specific procedures for assembling and producing the modules are known to the related industries.

The above-described preferred embodiment of the present invention is effective not only for the so-called low-molecular-weight type OLED display device described above, in which the organic layer is formed by vacuum evaporation, but also for the OLED display device referred to as the so-called polymer type. Moreover, the present invention is effective not only for production of an OLED display device referred to as the so-called bottom emission type, in which a glass substrate is coated with a transparent electrode, organic layer and cathode in this order, as described above, to emit electro-luminescence from the glass substrate (OLED substrate) side, but also for production of an OLED display device referred to as the so-called top emission type, in which a glass substrate is coated with a cathode, organic layer and transparent electrode in this order to emit electroluminescence from the encapsulating plate side. It should be stressed that the present invention is applicable to OLED display device assemblies without damaging its effectiveness, irrespective of from which side electroluminescence is emitted, which should be determined from device performance, productivity, economic efficiency and so on not related to the present invention.

The preferred embodiment of the present invention provides an OLED display device characterized by a laminate structure comprising an OLED substrate having pixels at least in the pixel area, filler and encapsulating plate, wherein the filler preferably comprises a desiccant dispersed with fine metallic particles to have increased thermo-conductivity and electroconductivity. This structure can simultaneously solve the problems of preventing inflow of moisture into the pixel area, securing mechanical strength, and, in addition, improving thermoconductivity and electroconductivity.

Moreover, the preferred embodiment of the present invention has the pixel area provided with a seal around its periphery, to securely protect the encapsulating structure constituting the pixel area from moisture or the like inflowing from the outside.

Figure 4:
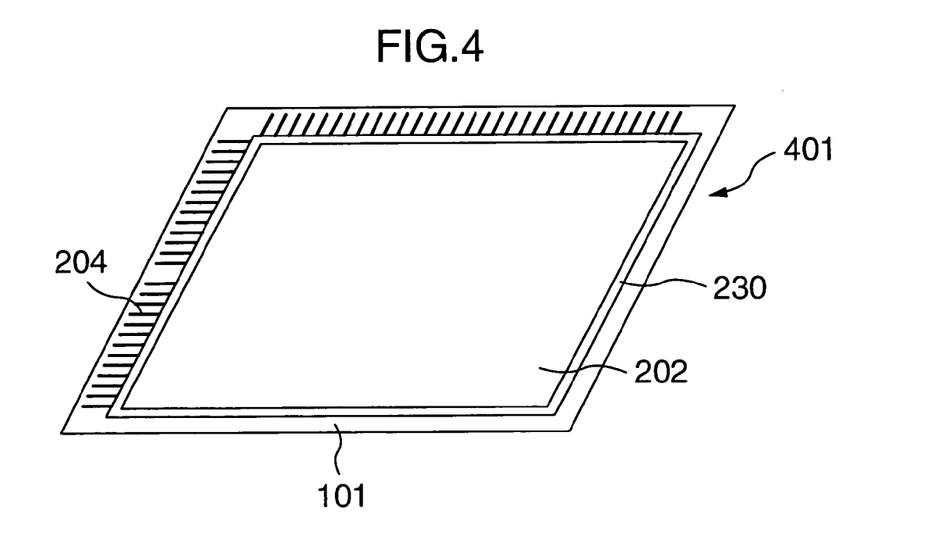
FIG. 4 schematically shows an internal structure of an OLED substrate constituting one embodiment of the OLED display device of the present invention.

FIG. 4 schematically shows an internal structure of an OLED substrate constituting one embodiment of the OLED display device of the present invention. As shown in FIG. 4, the OLED substrate 401 formed on the glass substrate 101 has the pixel area 202 provided with the insulator 203 around its periphery, which separates the anode (not shown) in the pixel area from the leading wirings 204 (or driver circuits 403 formed around the periphery of the pixel area, see FIG. 3).

Figure 5:
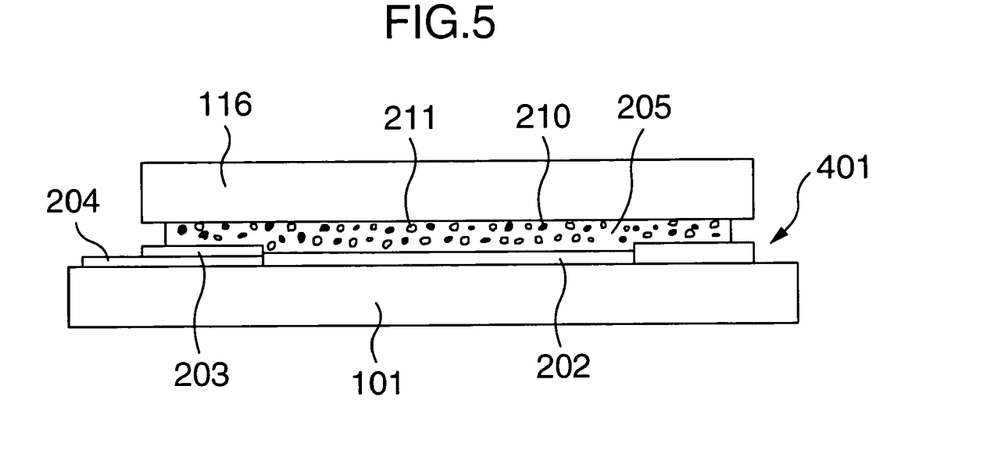
FIG. 5 is a cross-sectional view illustrating an encapsulating structure for one embodiment of the present invention.

FIG. 5 is a cross-sectional view illustrating an encapsulating structure for one embodiment of the present invention. As shown in FIG. 5, the encapsulating structure of the preferred embodiment is completed by coating the OLED substrate 401 with the filler 205 for the present invention, and also with the encapsulating plate 116, both on the side opposite to the glass substrate 101 which carries the OLED substrate 401. It can be said that this encapsulating structure is characterized by the filler 205 partly covering the insulator 203, provided around the periphery of the pixel area 202 on the OLED substrate 401.

Figure 6:
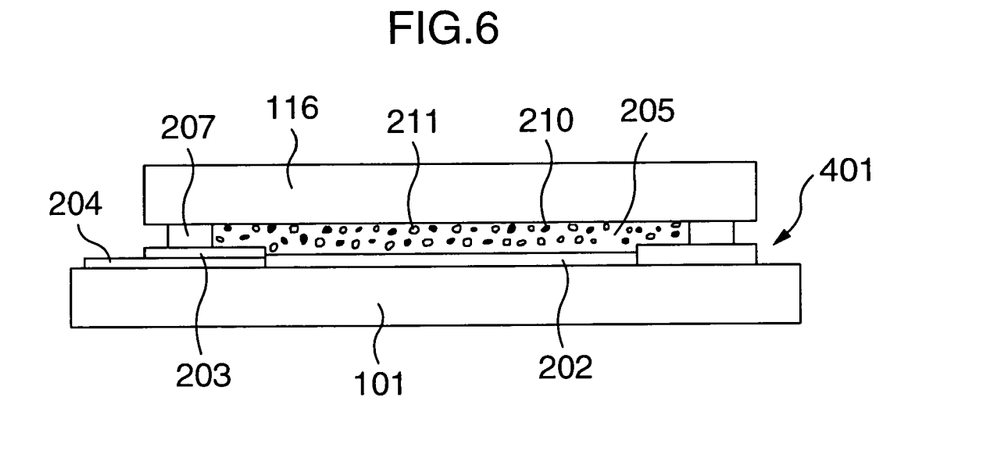
FIG. 6 is a cross-sectional view illustrating an encapsulating structure for another embodiment of the present invention.

FIG. 6 is a cross-sectional view illustrating an encapsulating structure for another embodiment of the present invention. The more preferred embodiment of the present invention has the seal 207 on the insulator 203, as shown in FIG. 6, to further enhance its capacity to block moisture inflow into the pixel area. Materials for the seal 207 are known to the related industries. This embodiment is characterized by the structure in which the insulator 203 provided around the periphery of the pixel area is coated with the seal 207, and the space enclosed by the seal 207 is filled with the filler 205 for the embodiment of the present invention. This encapsulating structure realizes excellent capacity for blocking moisture inflow, thereby greatly improving reliability of the OLED.

Moreover, the embodiment of the present invention has the structure in which the pixel area 202 is encapsulated by the filler 205, as shown in FIGS. 5 and 6, with the result that the pixel area 202 directly comes into contact with the encapsulating plate 116 to completely protect the OLED from damages. This structure is one of the greatest characteristics of this embodiment.

Still more, the embodiment of the present invention has the filler 205 dispersed with thermoconductive particles 210 to effectively remove heat generated in the OLED by radiating it through the encapsulating plate 116 or glass substrate 101, thereby greatly improving reliability of the OLED display device. Still more, the filler 205 is dispersed with electroconductive particles 211 which come into contact with the cathode constituting the OLED to have enhanced capacity for dispersing/flowing current for driving the diode. Use of the filler 205 dispersed with electroconductive particles 211 can avoid a problem of increased electrical resistance resulting from uneven film thickness of the cathode.

Figure 7:
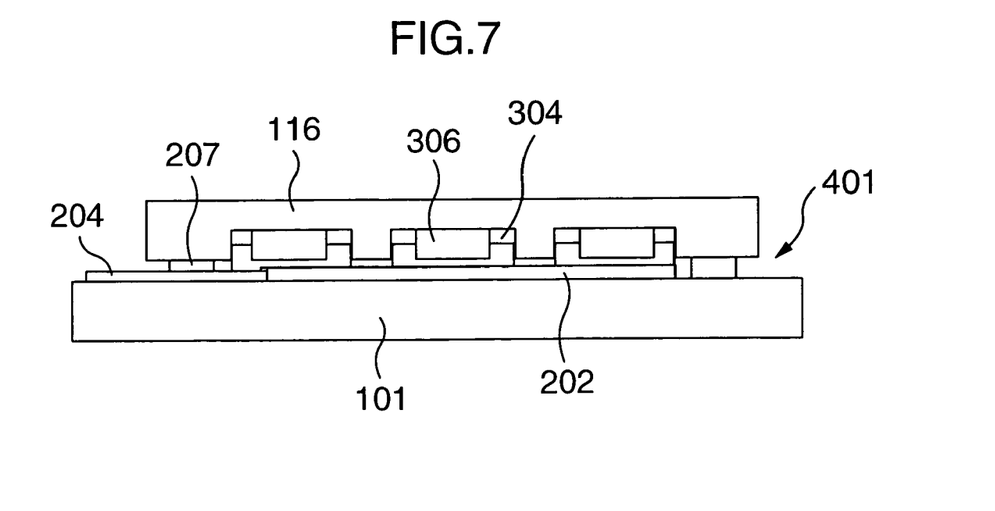
FIG. 7 is a cross-sectional view illustrating a conventional encapsulating structure for an OLED display device.
Figure 8:
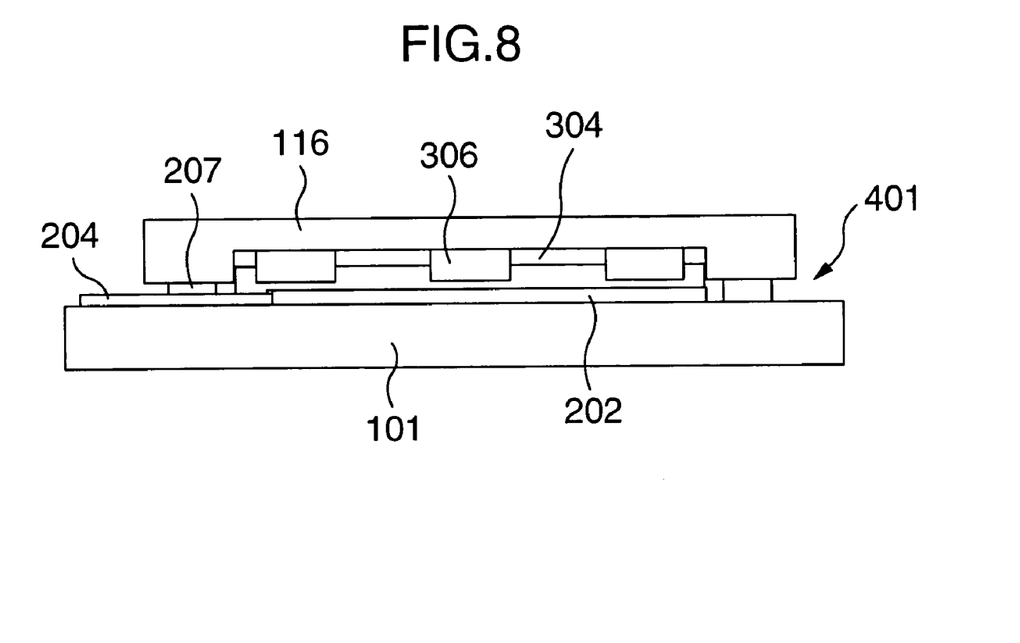
FIG. 8 is a cross-sectional view illustrating another conventional encapsulating structure for an OLED display device.

One example of conventional encapsulating structure is described for reference. FIG. 7 is a cross-sectional view illustrating a conventional encapsulating structure for an OLED display device. FIG. 8 is a cross-sectional view illustrating another conventional encapsulating structure for an OLED display device. A conventional enclapsulating structure comprises the glass substrate 101 which carries the pixel area 202 on the OLED substrate 401 and leading wiring 204. The encapsulating plate 116 is treated by etching or sand blasting to have cavity 304 on part of the inner side, in which the desiccant 306 is immobilized, and is bonded to the OLED substrate 401 by the seal 207. The encapsulating structure shown in FIG. 7 has a plurality of the cavities 304 formed on the inner side of the encapsulating plate 116, whereas that shown in FIG. 8 has one cavity which covers the whole pixel area on the inner side of the encapsulating plate 116. The encapsulating structures shown in these figures always involve a possibility of damaging the OLED, because the pixel area 202 comes into contact with the encapsulating plate 116. At the same time, the encapsulating space coming into contact with the pixel area 202 is filled with a gas, to greatly decrease thermoconductivity and electroconductivity in the space.

The embodiment of the present invention is characterized by the filler 205 dispersed with a desiccant (FIG. 2(f)). Use of a desiccant is common for OLED display devices, because an organic material constituting on OLED is sensitive to moisture and can easily deteriorate light-emitting characteristics, among others, when it absorbs moisture. However, the means for holding a desiccant in the filler 205 is one of the notable characteristics of the present invention. More specifically, a desiccant can be uniformly held by dispersing it in the filler 205. This can dispense with a work for including a desiccant in the device, thus improving economic efficiency. The lower limits of particle size and content of the desiccant are determined from necessity for securing its desiccating capacity while it is encapsulated, and the upper limits from necessity for encapsulating workability.

The desiccant for the embodiment of the present invention is preferably the one having a high desiccating capacity, e.g., an oxide of alkali-earth mental, alkali or alkali-earth metal element or phosphorus pentaoxide ($P_2O_5$). Its particle size is preferably 0.05 to 50 µm, and a content is preferably 0.1 to 10 % by weight in the filler.

It is recommended that the filler 205 for the embodiment of the present invention is a composite material comprising an organic resin as its one component dispersed with thermoconductive particles and electroconductive particles, or particles which are thermoconductive and electroconductive. This composite is commonly referred to as the filler in this specification. It is preferably bonded to the OLED substrate, or both the OLED substrate and encapsulating plate in the embodiment of the present invention.

Moreover, the space between the pixel area and encapsulating plate is filled with the filler of resin dispersed with metallic particles in the embodiment of the present invention. The metallic particles are preferably of highly thermoconductive ones, e.g., aluminum (Al), silver (Ag) or copper (Cu); or highly thermoconductive and electroconductive, and transparent ones, e.g., ITO, IZO or IZTO. Their size is preferably 0.05 to 50 µm, and a content is preferably 10 to 120 parts by weight per 100 parts by weight of the resin. The lower limits of particle size and content are determined from necessity for securing thermoconductivity while they are encapsulated, and the upper limits from necessity for encapsulating workability. Their transparency is needed for taking out light via the filler in the embodiment of the present invention.

The filler for the embodiment of the present invention, being dispersed with the metallic particles, has a thermal conductivity of 0.5 to 500 W/mK, preferably 5 to 500 W/mK. It is recommended to have an electroconductivity of 5 to 500 µΩ·cm, preferably 5 to 100 µΩ·cm in terms of specific resistivity. These upper and lower limits are determined viewed from the effects of improving life time and other characteristics of the OLED by thermoconductivity and electroconductivity of the filler, and from economic considerations.

The organic resin for the embodiment of the present invention preferably contains an epoxy, acrylic or silicone resin as the major ingredient. However, it should be noted that these resins are cited because of their relatively low cost and good handleability for economic encapsulation, but not to limit the present invention.

The preferred embodiments of the present invention are described in more detail by EXAMPLES.

EXAMPLE 1

The material having the following composition is used as one example of the filler for the embodiment of the present invention:

Filler 1

| Components | Composition |
|---|---|
| Epoxy resin | 100 parts by weight |
| Amine type curing agent | 30 parts by weight |
| Cu particles | 40 parts by weight |
| CaO particles | 5 parts by weight |
| Coupling agent | 0.1 parts by weight |

The epoxy resin may be a bisphenol A type resin commercially available, which is liquid at room temperature. A bisphenol A type epoxy resin is suitable because it makes the filler spreadable on a surface, and also preferable for preparation of a printing ink, as described later. The amine curing agent may be selected from various aliphatic or aromatic amine adducts. Curing agents of anhydrous acids or thiol-based one can be used by the related industries. The Cu particles are incorporated to impart thermoconductivity and electroconductivity to the filler. The fine metallic Cu particles having a size of around 1 µm can be used. The CaO particles are incorporated to impart desiccating capacity to the filler, and preferably have a size of 10 µm or less. The coupling agent is incorporated to further secure bonding of the organic resin and inorganic particles to each other. Use of a coupling agent for this purpose is known to the related industries.

The method for preparing the filler is specifically described. First, the above components are preliminarily kneaded for dispersion. A mixture having a viscosity suitable for a printing ink can be prepared by uniformly kneading the above mixture in a 3-roll mill for sufficient dispersion. All of the mixing/dispersion works are preferably carried out in a glove box completely free of mixture. The cured filler thus prepared exhibits excellent characteristics of around 10 W/mK as thermoconductivity and 80 µΩ·cm as specific resistivity.

Moreover, the material having the following composition is used as another example of the filler for the embodiment of the present invention:

Filler 2

| Components | Composition |
|---|---|
| Silicone resin | 100 parts by weight |
| Curing agent | 10 parts by weight |
| Ag particles | 50 parts by weight |
| CaO particles | 5 parts by weight |
| Coupling agent | 0.1 parts by weight |

It is preferable to use an addition-reaction type silicone gel for the silicone resin, and a dedicated curing agent for the curing agent. These resins are known to the related industries. The Ag particles are incorporated to impart thermoconductivity and electroconductivity to the filler. The fine metallic Ag particles having a size of around 0.5 μm can be used. The CaO particles are incorporated to impart desiccating capacity to the filler, and preferably have a size of 10 μm or less. The coupling agent is incorporated to further secure bonding of the organic resin and inorganic particles to each other. Use of a coupling agent for this purpose is known to the related industries.

The method for preparing the filler is specifically described. First, the above components are preliminarily kneaded for dispersion. A mixture having a viscosity suitable for a printing ink can be prepared by uniformly kneading the above mixture in a 3-roll mill for sufficient dispersion. All of the mixing/dispersion works are preferably carried out in a glove box completely free of mixture. The cured filler thus prepared exhibits excellent characteristics of around 20 W/mK as thermoconductivity and 50 μΩ·cm as specific resistivity. This embodiment can prepare the filler which can simultaneously solve the problems of removing moisture, securing mechanical strength and improving thermoconductivity and electroconductivity by the simple procedure described above.

EXAMPLE 2

A method adopted in this embodiment for applying the filler to encapsulating the OLED is described by referring to FIGS. 4 and 5. The filler 205 having the composition shown in EXAMPLE 1 is spread by screening printing on the pixel area 202 and insulator 203 on the OLED substrate 401 on which the transistor active matrix is formed by polysilicon on the glass substrate 101. The filler can be spread to a thickness which is controlled at 20 to 50 μm by use of a 300-mesh screen printing plate. The glass substrate for the encapsulating plate 116 is put on the filler, on completion of the printing work, to prevent bubbles from being drug onto the filler, and the filler is cured under heating at 120° C. for 30 minutes. All of the printing, placing the glass substrate and curing works are preferably carried out in a glove box completely free of mixture. It is recommended that moisture is removed to decrease dew point of −60° C. or lower in the glove box.

This embodiment can realize the encapsulating structure which can simultaneously solve the problems of removing moisture, securing mechanical strength and improving thermoconductivity and electroconductivity by the simple procedure described above.

EXAMPLE 3

Another method adopted in this embodiment for applying the filler to encapsulating the OLED is described by referring to FIG. 6. The filler 205 having the composition shown in EXAMPLE 1 is spread by screening printing on the pixel area 202 and insulator 203 on the OLED substrate 401 on which the transistor active matrix is formed by polysilicon on the glass substrate 101. The filler can be spread to a thickness which is controlled at 20 to 50 μm by use of a 300-mesh screen printing plate. On completion of the printing work, the seal 207 is spread by a dispenser or the like to a width of 2 mm on the insulator 203 in such a way to cover the periphery of the filler 205. An UV curing type may be used for the seal 207. Then, the glass substrate for the encapsulating plate 116 is put on the filler 205 and seal 207, on completion of the printing work, to prevent bubbles from being drug onto them, the seal 207 portion is selectively irradiated with UV to be cured, and the filler is cured under heating at 120° C. for 60 minutes. All of the printing, placing the glass substrate and curing works are preferably carried out in a glove box completely free of mixture. It is recommended that moisture is removed to decrease dew point of −60° C. or lower in the glove box.

This embodiment can realize the encapsulating structure which can simultaneously solve the problems of removing moisture, securing mechanical strength and improving thermoconductivity and electroconductivity by the simple procedure described above.

EXAMPLE 4

Figure 9:
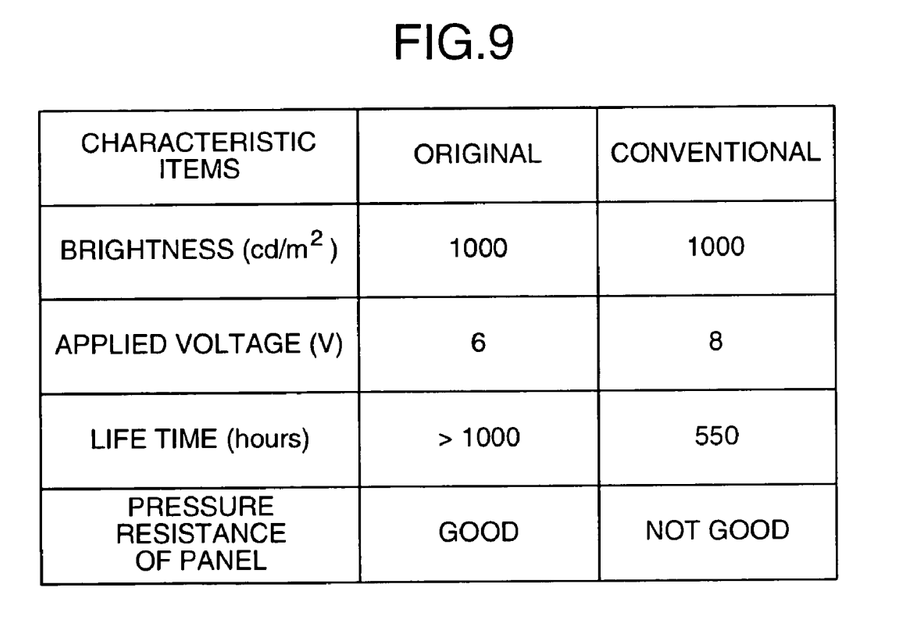
FIG. 9 compares effects of the OLED display device of the present invention with those of a conventional one.

Characteristics of the OLED panel in which the present invention was incorporated were investigated in detail. The results are described below. The OLED substrate which carries the pixel area is prepared following the procedure described in FIGS. 1 and 2, where the pixel area has the light-emitting region of 10 inches as nominal diagonal on the polysilicon transistor, and is provided with the OLED material and cathode in this order. The seal is spread onto the periphery around the pixel area and filler 1 having the composition shown in EXAMPLE 1 is spread onto the pixel area. Then, the 0.7 mm thick glass substrate for the encapsulating plate is put on the filler and seal, and the filler 1 is cured under heating at 120° C for 30 minutes, to prepare the encapsulating structure. An OLED panel, shown in FIG. 8, is prepared in the same manner for reference, except that the conventional encapsulating structure shown in FIG. 7 is used, to investigate its characteristics. FIG. 9 compares these OLED panels in some characteristics.

FIG. 9 compares the effects of the OLED display device of the present invention with those of the conventional OLED display device. One of the most important characteristics of an OLED display device is life time which is limited by deteriorated brightness while it is electrically driven to emit light. Normally, brightness is defined as half time of brightness, and is determined for the comparison. Brightness of emitted light of around 100 cd/m$^2$ is normally used. An OLED display device emits brighter light at a higher voltage, which is accompanied by deteriorated life time. The device of the present invention is compared with the conventional one by the accelerated test, in which their life times are determined at a brightness of 1000 cd/m$^2$. As shown in FIG. 9, the device of the present invention has a life time exceeding 1000 hours, whereas that of the conventional one is half or less of that level.

The OLED display device of the present invention has excellent life time, longer than 10,000 hours when it is converted to the level at a brightness of 100 cd/m$^2$. Moreover, it needs a lower driving voltage during the initial stage to produce light having a brightness of 1000 cd/m², and hence is favorable.

As discussed above, the OLED display device of the present invention is found to notably exhibit the effect of the seal made thermoconductive to swiftly remove heat generated in the light-emitting section, and the effect of excellent capacity for supplying power to the electrode. Moreover, the conventional encapsulating structure involves problems of being possibly damaged, when part of the light-emitting section is pressed, because the encapsulating plate may come into contact with the OLED. By contrast, the encapsulating structure for the present invention is found to be completely free of these problems. Therefore, it is found that the encapsulating structure for each of the preferred embodiments of the OLED display device of the present invention is excellent in reliability and life time.

EXAMPLE 5

Figure 10:
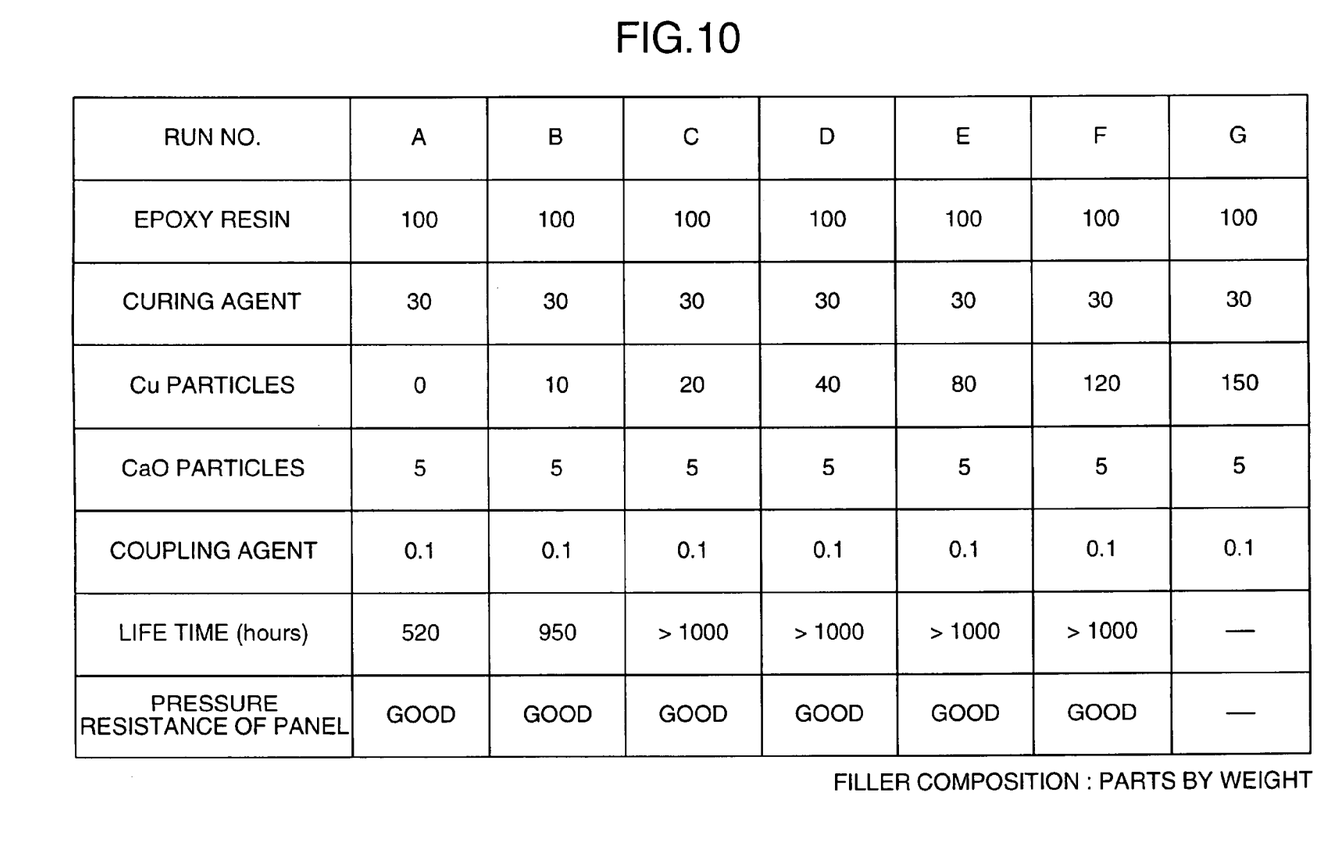
FIG. 10 illustrates the results of comparing the metallic copper particle compositions in the filler 1 for the OLED display device having a structure similar to that of the preferred embodiment described in Example 4.

FIG. 10 illustrates the results of comparing the metallic copper particle compositions in the filler 1 for the OLED display device having a structure similar to that of the preferred embodiment described in EXAMPLE 4. Referring to FIG. 10, the filler (A) completely free of metallic copper particles exhibits insufficient effect of improving life time, although securing pressure resistance. By contrast, the fillers exhibit the effect of improving life time when they contain metallic copper particles at 10 parts by weight or more, more notably 20 parts by weight or more. It is also found that the filler containing metallic copper particles at 150 parts by weight or more cannot be easily adjusted for viscosity, and is difficult to make an ink for screen printing.

Figure 11:
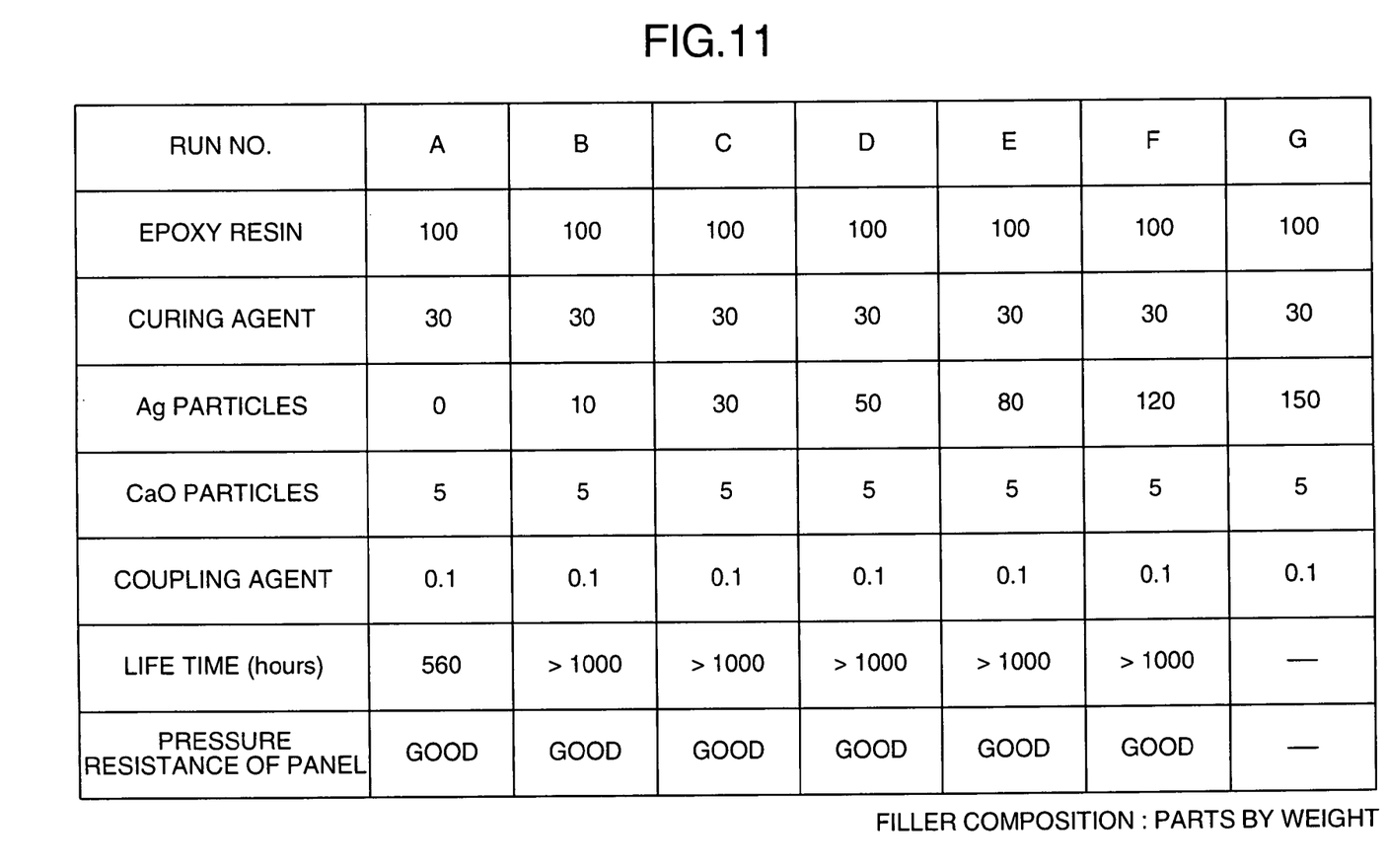
FIG. 11 illustrates the results of comparing the metallic silver particle compositions in the filler 2 for the OLED display device having a structure similar to that of the preferred embodiment described in Example 4.

FIG. 11 illustrates the results of comparing the metallic silver particle compositions in the filler 2 for the OLED display device having a structure similar to that of the preferred embodiment described in EXAMPLE 4. Referring to FIG. 11, the filler (A) completely free of metallic silver particles exhibits insufficient effect of improving life time, although securing pressure resistance. By contrast, the fillers exhibit the effect of improving life time when they contain metallic silver particles at 10 parts by weight or more, more notably 30 parts by weight or more. It is also found that the filler containing metallic copper particles at 150 parts by weight or more cannot be easily adjusted for viscosity, and is difficult to make an ink for screen printing. These results indicate that the encapsulating structure of the present invention is suitable for the OLED display device excellent in reliability and life time, when its filler contains metallic particles at 10 to 120 parts by weight.

EXAMPLE 6

The preferable OLED display device size (panel size) is studied for the devices which include the encapsulating structure of the preferred embodiment of the present invention. The results indicate that it is recommended to apply the structure of the preferred embodiment to the device having a nominal diagonal of 5 inches or more, preferably 10 inches or more, when the size is converted to that at a length/breadth ratio of 4:3. The panel size is determined based on the overall considerations of required power for the OLED display device, quantity of heat generated and flexural rigidity of the encapsulating plate, among others. The present invention can exhibit its advantages more notably as panel size increases.

EXAMPLE 7

The OLED display of the present invention is effective not only for the so-called low-molecular-weight type OLED display, in which the organic layer is formed by vacuum evaporation as described above, but also for the OLED display device referred to as the so-called polymer type.

Figure 12:
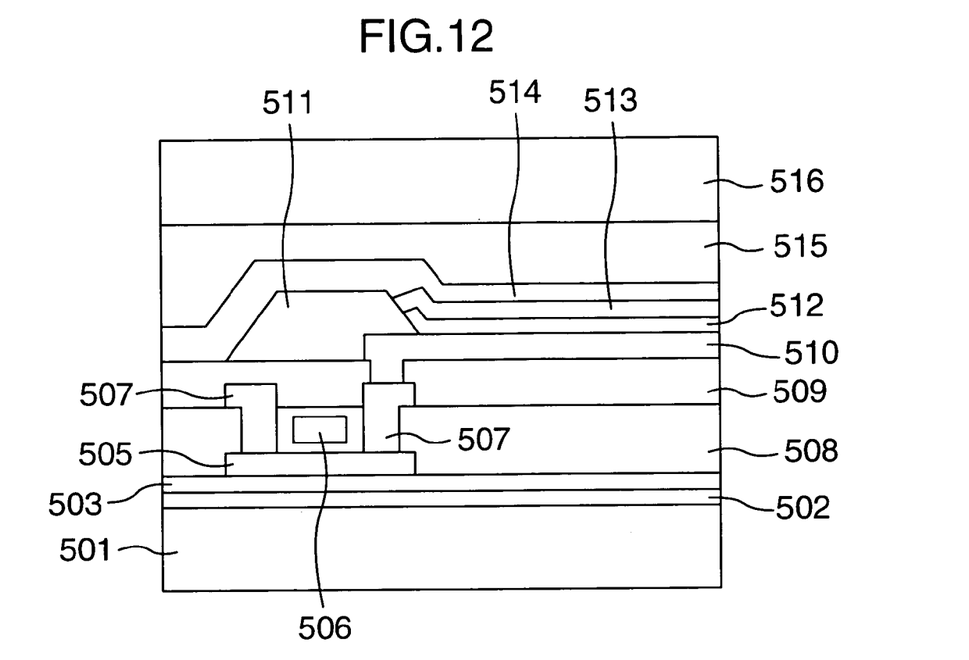
FIG. 12 is a cross-sectional view of a polymer type OLED display device to which the present invention is applied.

FIG. 12 is a cross-sectional view of the preferred embodiment of the polymer type OLED display device to which the present invention is applied. Referring to FIG. 12, the glass substrate 501 is coated thinly with the SiN film 502 and SiO film 503 serving as a layered barrier film by an adequate procedure, e.g., CVD, and then with an amorphous silicon film (not shown) to a thickness of around 50 nm by CVD. Next, the amorphous silicon film is modified into the polysilicon film 505 by crystallization means, e.g., excimer laser annealing for the portion on which the pixel circuits are to be formed.

The modified silicon film 505, formed by the procedure described above, is etched into an island shape to have an intended circuit, and coated with a gate insulator (not shown), the gate wiring 506, interlayer insulator 507, source drain wiring 508, passivator 509 and transparent electrode 510, in this order, to form the active matrix substrate, i.e., OLED substrate, on which the transistor circuits are disposed on the pixel area.

For production of the OLED display device of the preferred embodiment, the diode separation zone 511 is formed on the periphery of the transparent electrode 510 on the active matrix substrate. Then, the transparent electrode 510 is coated with a polymer positive hole transfer layer 512 of an organic EL material, a polymer light-emitting layer/electron transfer layer 513 and cathode 514, in this order. It is known that a multi-color display can be produced by forming the light-emitting layer/electron transfer layers 513 emitting different colors only on the specific, transparent electrodes 510 by a printing means, e.g., ink jet, in the process for forming the above layers.

An OLED display device is normally produced by the following procedures. However, it should be stressed that the procedures described below are examples intended to illustrate but not to limit the present invention.

(1) Pretreatment of ITO Electrode

The OLED display device is treated with an oxygen plasma for 2 minutes, after the device carrying an ITO electrode is placed in a vacuum chamber with the electrode surface exposed.

(2) Formation of Polymer Positive Hole Injection Layer

An aqueous solution containing polyethylenedioxythiophene (PEDT) for positive hole injection is spread over the ITO electrode by an ink-jet printer, and dried under heating to a thickness of, e.g., 80 nm (thickness of the finished film).

(3) Formation of Polymer Light-Emitting Layer/Electron Transfer Layer

A solution containing poly(2-methoxy-5(2'-ethyl)hexoxyphenylene vinylene (MEH-PPV) for the polymer light-emitting layer/electron transfer layer is spread over the positive hole injection layer by an ink-jet printer, and dried under heating, to a thickness of, e.g., 200 nm.

(4) Formation of Cathode

Metallic Ca for electron injection and aluminum (Al) for the cathode are continuously evaporated using an evaporation mask onto the entire pixel area except its periphery. The boat is heated in a controlled manner to secure the conditions of substrate temperature: room temperature, degree of vacuum: $10^{-4}$ Pa and evaporation rate: 0.1 to 1 nm/second, to have a Ca film thickness of 50 nm and Al thickness of 100 nm as one example.

On completion of the above procedures, the filler for the present invention is used to encapsulate the OLED display device. The filler 1 described in EXAMPLE 1 is spread by printing, covered with the glass substrate and cured following the procedures similar to those for EXAMPLE 3, to form the encapsulating structure. The present invention also can produce the encapsulating structure suitable for the polymer OLED display device by the above procedures.

EXAMPLE 8

The OLED display of the present invention is effective not only for production of an OLED display device referred to as the so-called bottom emission type, in which a glass substrate is coated with a transparent electrode, organic layer and cathode in this order, as described above, to emit electroluminescence from the glass substrate side, but also for production of an OLED display device referred to as the so-called top emission type, in which a glass substrate is coated with a cathode, organic layer and transparent electrode in this order to emit electroluminescence from the encapsulating plate side.

Figure 13:
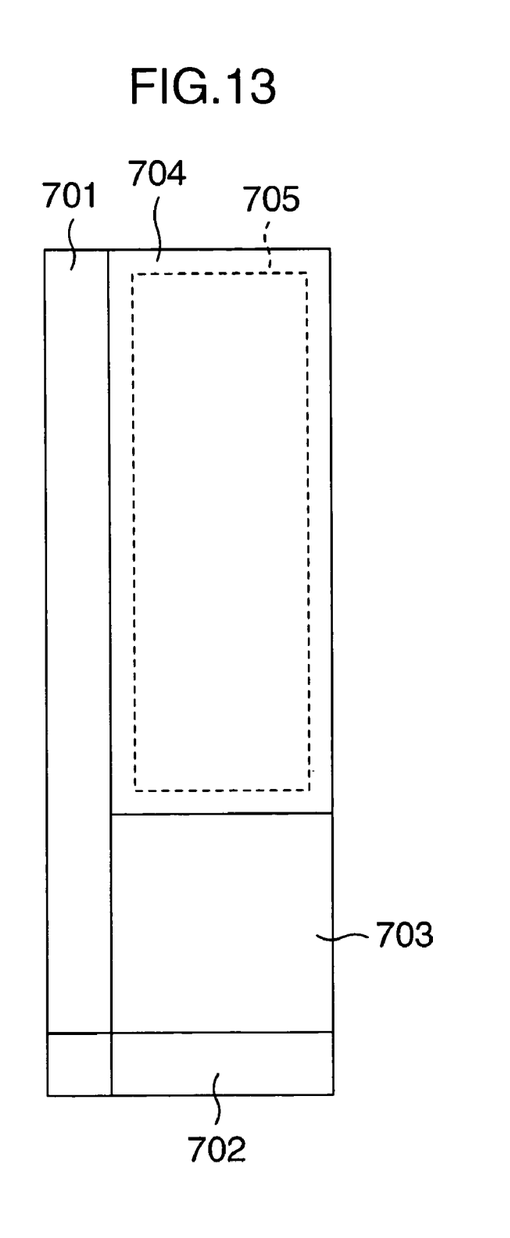
FIG. 13 illustrates a disposition of pixels in a bottom emission type OLED display device.
Figure 14:
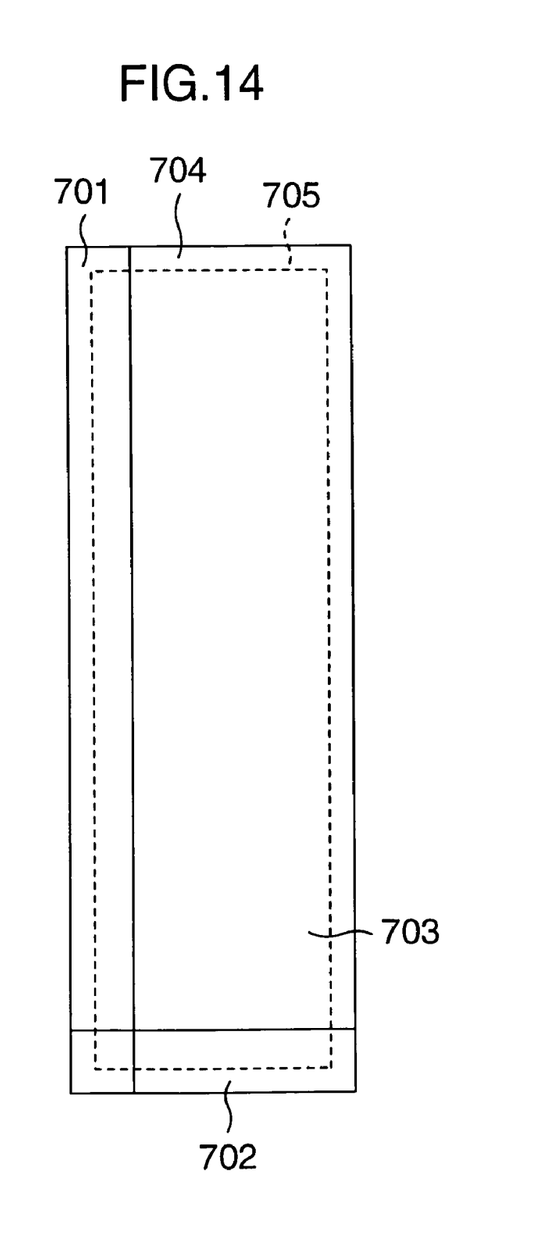
FIG. 14 illustrates a disposition of pixels in a top emission type OLED display device.

FIG. 13 illustrates disposition of pixels in a bottom emission type OLED display device, and FIG. 14 disposition of pixels in a top emission type OLED display device. In a bottom emission type OLED, the pixel circuit forming region 703 is secured on the region except the source side wiring region 701 and gate side wiring region 702. It is therefore necessary to secure the effective light-emitting region 705 on the light-emitting region 704 except these wiring regions (FIG. 13). As a result, ratio of the effective light-emitting region 705 to the pixel area is reduced, generally to around a half (½) to one-fifth (⅕).

In a top emission type OLED, on the other hand, the light-emitting region 704 can be formed on the same position as those for the source side wiring region 701, gate side wiring region 702 and pixel circuit forming region 703, as shown in FIG. 14, to increase ratio of the effective light-emitting region 705 to the pixel area to almost 1. As a result, the top emission type OLED display device has a great advantage of significantly improved efficiency over the bottom emission type, because it has a 2 to 5 times larger effective light-emitting region. At the same time, it consumes more power. Therefore, use of the encapsulating structure for the present invention can realize the top emission type OLED display device excellent in heat radiation and power supplying capacity.

Figure 15:
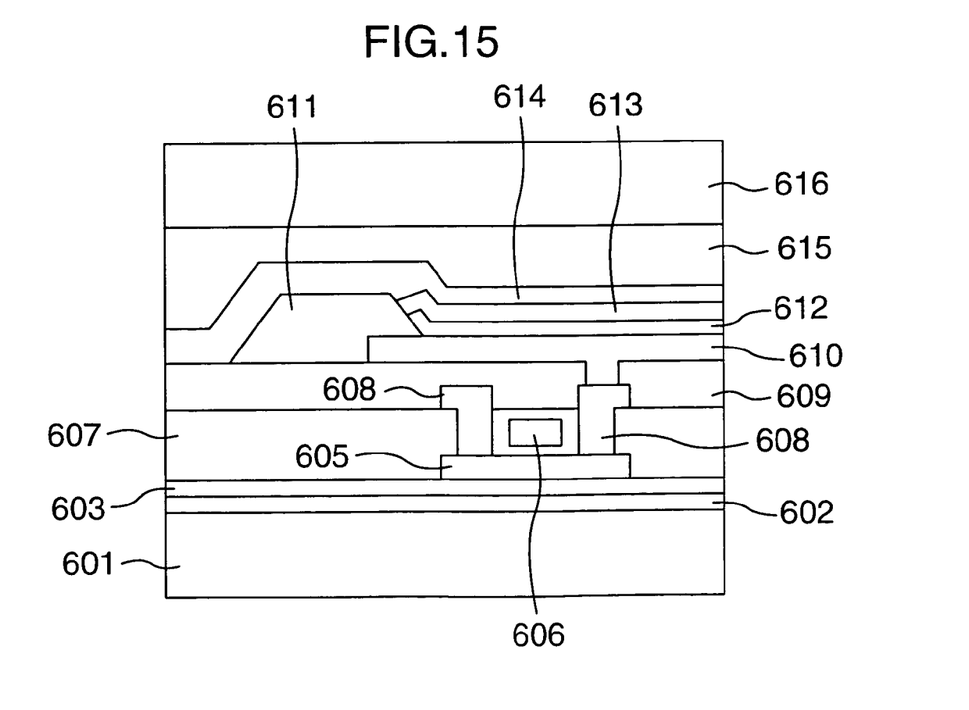
FIG. 15 is a cross-sectional view of another embodiment of the OLED display device to which the present invention is applied.

FIG. 15 is a cross-sectional view of another embodiment of the OLED display device to which the present invention is applied. It is a top emission type OLED display device. Referring to FIG. 15, the glass substrate 601 is coated thinly with the SiN film 602 and SiO film 603 serving as a layered barrier film by an adequate procedure, e.g., CVD, and then with an amorphous silicon film (not shown) to a thickness of around 50 nm by CVD. Next, the amorphous silicon film is modified into the polysilicon film 605 by crystallization, e.g., excimer laser annealing for the portion on which the pixel circuits are to be formed.

The modified silicon film 605, formed by the procedure described above, is etched into an island shape to have an intended circuit, and coated with a gate insulator (not shown), the gate wiring 606, interlayer insulator 607, source, drain wiring 608, passivator 609 and Al cathode 610, in this order, to form the active matrix substrate (OLED substrate) on which the transistor circuits are disposed on the pixel area. This embodiment can have the transistor circuits under the light-emitting region.

For production of the OLED display device of the preferred embodiment, the diode separation zone 611 is formed on the periphery of the cathode 610 on the active matrix substrate (OLED substrate). Then, the cathode 610 is coated with the polymer light-emitting layer/electron transfer layer 612 of an organic EL material, hole injection layer 613 and transparent electrode 614, in this order. It is known that a multi-color display can be produced by forming the light-emitting layer/electron transfer layers 612 emitting different colors only on the specific cathodes 610 by a printing means, e.g., ink jet, in the process for forming the above layers.

An OLED display device is normally produced by the following procedures. However, it should be stressed that the procedures described below are examples intended to illustrate but not to limit the present invention. It should be particularly stressed that the present invention can also exhibit the similar effect when applied to a low-molecular-weight OLED.

(1) Pretreatment of Cathode

The cathode on the OLED substrate is surface-treated by Ar plasma cleaning for 30 seconds for pretreatment.

(2) Formation of Polymer Light-Emitting Layer/Electron Transfer Layer

A solution containing poly(2-methoxy-5(2'-ethyl)hexoxy-phenylene vinylene (MEH-PPV) for the polymer light-emitting layer/electron transfer layer is spread over the hole injection layer by an ink-jet printer, and dried under heating, to a thickness of, e.g., 200 nm.

(3) Formation of Polymer Positive Hole Injection Layer

An aqueous solution containing polyethylenedioxythiophene (PEDT) for positive hole injection is spread over the ITO electrode by an ink-jet printer, and dried under heating to a thickness of, e.g., 80 nm (thickness of the finished film)

(4) Formation of Transparent Electrode

ITO is sputtered using an evaporation mask to be deposited on the whole pixel area except the periphery to a thickness of 70 nm in the anode section, while the substrate is kept at room temperature.

On completion of the above procedures, the space between the OLED substrate and encapsulating plate 616 is filled with the filler 615, to make the whole assembly multi-layered, as is the case with the previous embodiment. The filler 3 having the composition described below is spread by printing, covered with the glass substrate and cured following the procedures similar to those for EXAMPLE 3, to form the encapsulating structure. The filler 3 is incorporated with the following thermoconductive and electroconductive particles (ITO particles in this case), in addition to the desiccant.

Filler 3

| Components | Composition |
| --- | --- |
| Epoxy resin | 100 parts by weight |
| Amine type curing agent | 30 parts by weight |
| ITO particles | 40 parts by weight |
| CaO particles | 3 parts by weight |
| Coupling agent | 0.1 parts by weight |

This embodiment can produce the encapsulating structure suitable for the so-called top emission type OLED display device by the above procedures. This type OLED display device has an advantage of higher brightness over the bottom emission type, because it can form the light-emitting region also on the pixel circuits.

As discussed above, the present invention provides an OLED display device which can simultaneously realize preventing inflow of moisture into the pixel area on which OLEDs are disposed, securing mechanical strength of the pixel area, and improving thermoconductivity and electroconductivity. Use of the encapsulating structure for the present invention provides a highly reliable display device at a low cost.

While we have shown and described several embodiments in accordance with our invention, it should be understood that the disclosed embodiments are susceptible of changes and modifications without departing from the scope of the invention. Therefore, we do not intend to be bound by the details shown and described herein but intend to cover all such changes and modifications a fall within the ambit of the

What is claimed is:

1. An organic light emitting diode (OLED) display device comprising:
   an OLED substrate having on a surface thereof a pixel area in which a plurality of pixels are formed in a matrix form, leading wirings extended from the pixel area to outside of the pixel area at a periphery of the OLED substrate, and having an insulator formed around a periphery of the pixel;
   an encapsulating plate which encapsulates at least the pixel area; and
   a filler which fills a space between the OLED substrate and the encapsulating plate,
   wherein each of the plurality of pixels includes an OLED and a pixel circuit for driving the OLED,
   the OLED has a diode structure farmed of a first electrode, an organic region and a second electrode laminated on the surface of the OLED substrate in this order,
   the second electrode is formed entirely in the pixel area to be extended between the pixels while the first electrode in different ones of the pixels are separated from one another,
   the insulator separates the second electrode in the pixels area from the leading wirings covered with the insulator,
   said filler is formed of a resin dispersed with particles and is thermoconductive and electroconductive, and
   the filler is in contact with the second electrode in the pixel area and the encapsulating plate in the space and is not extended beyond the insulator.

2. The OLED display device according to claim 1, wherein said filler is dispersed with a desiccant.

3. The OLED display device according to claim 2, wherein said desiccant is of an organic silane compound.

4. The OLED display device according to claim 2, wherein the particles and a desiccant are disposed between said OLED substrate and said encapsulating plate.

5. The OLED display device according to claim 2, wherein said desiccant is selected from the group consisting of powdered CaO and powdered BaO.

6. The OLED display device according to claim 1 which has a seal bonded to the insulator formed on the surface of said OLED substrate and to said encapsulating plate at an outer periphery of said pixel area,
   wherein a space enclosed by the OLED substrate, the encapsulating plate and the seal is filled with the filler.

7. The OLED display device according to claim 1, wherein said filler is bonded to both said OLED substrate and said encapsulating plate.

8. The OLED display device according to claim 1, wherein said filler comprises a resin whose major ingredient is selected from the group consisting of epoxy, acrylic and silicone resin.

9. The OLED display device according to claim 1, wherein said encapsulating plate is flat.

10. The OLED display device according to claim 9, wherein said encapsulating plate is a glass substrate or a composite plate of an inorganic material and an organic material.

11. The OLED display device according to claim 1, wherein the particles are disposed between the pixel area formed on said OLED substrate and said encapsulating plate.

12. The OLED display device according to claim 1 which has a picture area of 10 inches or more in nominal diagonal.

13. The OLED display device according to claim 1, wherein said OLED constituting said pixel is a polymer OLED.

14. The OLED display device according to claim 1 which is of a top emission type in which an emitting light of said pixel is radiated through said encapsulating plate,
   wherein the particles are formed of a material selected from the group consisting of ITO, IZO and IZTO.

15. The OLED display device according to claim 1, wherein the particles in the filler are contacting the second electrode to enhance capacity for flowing a driving current of the diode structure in each of the plurality of pixels in the pixel area.

16. The OLED display device according to claim 1, wherein:
   the second electrode of each of the pixels is a cathode of the diode structure, and
   the organic region includes a hole transfer layer and a light emitting/electron transfer layer laminated on the first electrode in this order.

17. The OLED display device according to claim 1, wherein:
   the first electrode of eacho of the pixels is a cathode of the diode structure,
   the second electrode thereof is a transparent electrode,
   the organic region thereof includes a light emitting/electron transfer layer and a hole injection layer formed on the first electrode in this order, and
   the particles dispersed in the filler are formed of ITO.

18. The OLED display device according to claim 1, wherein the filler dispersed with the particles covers an upper surface of the pixel area opposite to the surface of the OLED substrate.

19. An organic light emitting diode (OLED) display device comprising:
   an OLED substrate having on a surface thereof a pixel area in which a plurality of pixels are formed in a matrix form, leading wirings extended from the pixel area to outside of the pixel area at a periphery of the OLED substrate, and having an insulator formed around a periphery of the pixel;
   an encapsulating plate which encapsulates at least the pixel area; and
   a filler which fills a space between the OLED substrate and the encapsulating plate, wherein each of the plurality of pixels includes an OLED and a pixel circuit for driving the OLED, the OLED has a diode structure formed of a first electrode, an organic region and a second electrode laminated on the surface of the OLED substrate in the order, the second electrode is formed entirely in the pixel area to be extended between the pixels while the first electrode in different ones of the pixels are separated from one another, the insulator separates the second electrode in the pixels area from the leading wirings covered with the insulator, said filler contains metallic particles, and the filler is in contact with the second electrode in the pixel area and the encapsulating plate in the space and is not extended beyond the insulator.

20. The OLED display device according to claim 19, wherein said metallic particles are from 0.05 to 50 μm in particle size, are selected from the group consisting of aluminum, silver, copper and transparent electroconductive particles, and are contained in 10 to 120 parts by weight per 100 parts by weight of said resin.

21. The OLED display device according to claim 19, wherein said filler has a thermoconductivity of from 5 to 500 W/m$^2$k and a resistivity of from 5 to 100 μΩ·cm.

22. The OLED display device according to claim 19, wherein the filler containing the metallic particles covers an upper surface of the pixel area opposite to the surface of the OLED substrate.

* * * * *